(12) United States Patent
Kim et al.

(10) Patent No.: US 8,310,799 B2
(45) Date of Patent: *Nov. 13, 2012

(54) TRANSIENT VOLTAGE PROTECTION DEVICE, MATERIAL, AND MANUFACTURING METHODS

(75) Inventors: Kyle Yun-Su Kim, Manteca, CA (US); Hundi Panduranga Kamath, Los Altos, CA (US); Daniel Minas Manoukian, San Ramon, CA (US)

(73) Assignee: Cooper Technologies Company, Houston, TX (US)

( * ) Notice: Subject to any disclaimer, the term of this patent is extended or adjusted under 35 U.S.C. 154(b) by 8 days.

This patent is subject to a terminal disclaimer.

(21) Appl. No.: 12/489,253

(22) Filed: Jun. 22, 2009

(65) Prior Publication Data
US 2009/0257166 A1  Oct. 15, 2009

Related U.S. Application Data

(63) Continuation of application No. 11/186,514, filed on Jul. 21, 2005, now Pat. No. 7,567,416.

(51) Int. Cl.
*H02H 1/00* (2006.01)
*H01B 1/12* (2006.01)
*H01C 7/10* (2006.01)

(52) U.S. Cl. ............... 361/126; 361/127; 252/519.33; 338/21

(58) Field of Classification Search .......... 361/126, 361/127; 252/519.33; 338/21
See application file for complete search history.

(56) References Cited

U.S. PATENT DOCUMENTS

| | | | |
|---|---|---|---|
| 4,011,426 A | 3/1977 | Lange | |
| 4,726,991 A | 2/1988 | Hyatt et al. | |
| 4,928,199 A | 5/1990 | Diaz et al. | |
| 4,977,357 A | 12/1990 | Shrier | |
| 5,142,263 A | 8/1992 | Childers et al. | |
| 5,189,387 A | 2/1993 | Childers et al. | |
| 5,246,388 A | 9/1993 | Collins et al. | |
| 5,262,754 A | 11/1993 | Collins | |
| 5,807,509 A | 9/1998 | Shrier et al. | |
| 6,013,358 A | 1/2000 | Winnett et al. | |
| 6,064,094 A | 5/2000 | Intracter et al. | |
| 6,087,923 A * | 7/2000 | Ahn et al. | 338/21 |
| 6,108,184 A | 8/2000 | Minervini et al. | |
| 6,130,459 A | 10/2000 | Intracter | |
| 6,160,695 A | 12/2000 | Winnett et al. | |
| 6,172,590 B1 | 1/2001 | Shrier et al. | |

(Continued)

FOREIGN PATENT DOCUMENTS

EP  0930623 A1  7/1999

(Continued)

OTHER PUBLICATIONS

Search Report for application No. GB0612909.2; Nov. 8, 2006; 1 page.

*Primary Examiner* — Jared Fureman
*Assistant Examiner* — Scott Bauer
(74) *Attorney, Agent, or Firm* — Armstrong Teasdale LLP

(57) ABSTRACT

A transient voltage suppression device includes a dielectric layer defining a receptacle for a variable impedance material proximate a gapped electrode. Methods for manufacturing the device and for formulating a variable voltage material at lower cost and with higher manufacturing yields is also provided.

43 Claims, 10 Drawing Sheets

U.S. PATENT DOCUMENTS

| | | |
|---|---|---|
| 6,191,928 B1 | 2/2001 | Rector et al. |
| 6,239,687 B1 | 5/2001 | Shrier et al. |
| 6,310,752 B1 | 10/2001 | Shrier et al. |
| 6,373,719 B1 | 4/2002 | Behling et al. |
| 6,433,394 B1 | 8/2002 | Intrater |
| 6,498,715 B2 | 12/2002 | Lee et al. |
| 6,542,065 B2 | 4/2003 | Shrier et al. |
| 6,570,765 B2 | 5/2003 | Behling et al. |
| 6,657,532 B1 | 12/2003 | Shrier et al. |
| 6,711,807 B2 | 3/2004 | Duggal et al. |
| 6,809,626 B2 | 10/2004 | Chu et al. |
| 7,034,652 B2 | 4/2006 | Whitney et al. |
| 7,049,926 B2 | 5/2006 | Shrier et al. |
| 2003/0025587 A1* | 2/2003 | Whitney et al. ............. 338/22 R |
| 2004/0022001 A1* | 2/2004 | Chu et al. ...................... 361/103 |
| 2007/0019346 A1 | 1/2007 | Kim et al. |

FOREIGN PATENT DOCUMENTS

| | | |
|---|---|---|
| JP | 2000181869 | 7/2000 |
| JP | 2004172207 | 6/2004 |
| WO | 9641356 | 12/1996 |

* cited by examiner

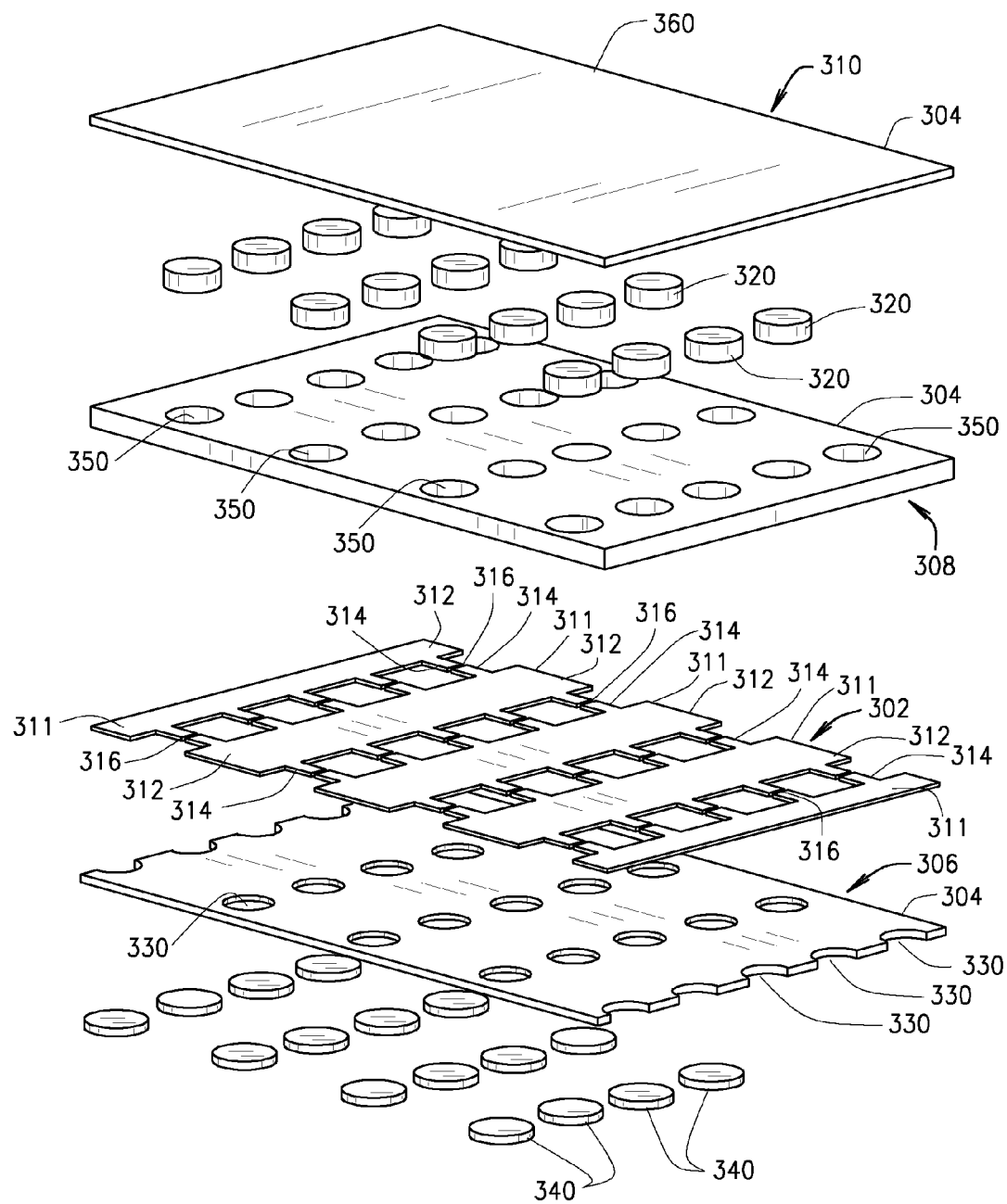
F I G . 9

TRANSIENT VOLTAGE PROTECTION DEVICE, MATERIAL, AND MANUFACTURING METHODS

CROSS REFERENCE TO RELATED APPLICATIONS

This application is a continuation application of U.S. patent application Ser. No. 11/186,514 filed Jul. 21, 2005, the complete disclosure of which is hereby incorporated by reference in its entirety.

BACKGROUND OF THE INVENTION

This invention relates generally to overvoltage protection devices for protecting electronic equipment and to methods of making such devices, and more specifically to devices that are commonly referred to as "surge protection" or "transient voltage suppression" devices.

Transient voltage suppression devices have been developed in response to the need to protect the ever-expanding number of electronic devices upon which today's technological society depends from high voltages of a short, or transient duration. Electrical transient voltages can be created by, for example, electrostatic discharge or transients propagated by human contact. Examples of electrical equipment which typically employ transient voltage protection equipment include telecommunications systems, computer systems and control systems.

Some known transient voltage suppression devices include a material having a variable impedance that interconnects, for example, a signal conductor pad and a ground conductor pad formed upon a ceramic substrate or printed circuit board substrate materials. Variable impedance materials, also sometimes referred to as "overstress responsive compositions" are sometimes fabricated as a mixture of conductive and/or semiconductive particles suspended as a matrix within a binding material such as an insulative resin. The signal and ground pads are separated by a small gap on the surface of the substrate, and the variable impedance material is placed into the gap to interconnect the ground and signal conductors. Through-holes or vias extend through the substrate on either end of the device and are plated to provide an electrical path to the signal and ground pads on the substrate. In a surface mount device, one of the plated vias may be connected to a signal conductor or trace of a circuit board, and the other of the plated vias may be connected to a ground conductor trace of a circuit board. The signal and ground pads of the device are therefore connected to signal and ground conductors, respectively, of an electrical system to be protected.

The variable impedance material exhibits a relatively high resistance (sometimes referred to herein as the "off-state") when the voltage and/or current passing through the signal conductor is within a specified range, and a relatively low impedance (referred to herein as the "on-state") when the voltage and/or current exceeds a predetermined threshold. In the on-state, the pulse or transient voltage experienced by the signal conductor will be shunted through the device to the ground conductor of the electrical system, and the voltage associated with the pulse will be clamped at a relatively low value for the duration of the pulse. The variable impedance material recovers after the voltage or current pulse has passed and returns to its high impedance state.

While such devices can be effective to protect electronic equipment from transient pulses, they are subject to a number of manufacturing difficulties. For example, the ground and signal pads are typically formed by etching and photolithographic techniques in which layers of conductive material are removed from the substrate, sometimes referred to as a subtractive formation process, to form the ground and signal pads. The gap between the ground and signal pads is typically cut or machined with a laser or other known technique at a separate stage of manufacture from the conductor formation, and controlling the gap formation is difficult and expensive.

Additionally, compounding the variable impedance material involves many processing stages and can also be difficult to consistently produce. Due to the small size of some devices, especially in chip type devices, the variable impedance material can be difficult to apply to the gap, and providing termination structure to connect the device to circuitry can be problematic. Cumulatively, these and other difficulties lead to higher production costs and decreased manufacturing yields of acceptable devices in the fabrication process.

It would be desirable to provide a lower cost and more reliable manufacture of such devices so that transient voltage suppression devices may be produced with increased production yields.

BRIEF SUMMARY OF THE INVENTION

According to an exemplary embodiment, a transient voltage suppression device is provided. The device comprises a first dielectric layer, and at least one electrode extending on the first dielectric layer and defining a conductive path. The electrode includes a gap that interrupts the conductive path, and a variable impedance material substantially fills the gap in the electrode, and a second dielectric layer overlies the electrode, wherein the electrode is sandwiched between the first and second dielectric layers and at least one of the first and second dielectric layers are formed with at least one opening proximate the gap and defining a receptacle for the variable impedance material.

According to another embodiment, a transient voltage suppression chip device is provided. The chip device comprises a first dielectric layer, an electrode extending on the first dielectric layer and including at least one gap that interrupts a conductive path through the electrode, and a second dielectric layer overlying the electrode, wherein the electrode is sandwiched between the first and second dielectric layers. The second dielectric layer is formed with an opening overlying the gap, and a variable impedance material is situated in the opening and substantially fills the gap in the electrode. The variable impedance material exhibits a relatively high impedance when subjected to voltage and/or current up to a predetermined threshold value, and exhibits a relatively low impedance when subjected to voltage and/or current that exceeds the predetermined threshold. A third dielectric layer overlies the second layer and closes the opening in the second dielectric layer, and surface mount terminations establish a conductive path to the electrode on either side of the gap.

According to still another embodiment, a transient voltage suppression device comprises first and second dielectric layers each defining at least one variable impedance opening therein, and at least one electrode extending between the first dielectric layer and including at least one gap that interrupts a conductive path through the electrode. The electrode is an electroformed foil formed independently of the first and second dielectric layers and integrally formed with the gap, and the electrode is sandwiched between the first and second dielectric layers. The variable impedance openings of the first and second dielectric layers are positioned proximate the gap, and the third and fourth dielectric layers are situated on the first and second dielectric layers, respectively, wherein the third and fourth layers close the openings in the first and second dielectric layers and the first, second, third and fourth dielectric layers are secured to one another to form a chip structure. A variable impedance material is situated in the openings of the first and second dielectric layers and substantially surrounds the electrode from above and below, and surface mount terminations establish a conductive path to the electrode on either side of the gap.

A method of manufacturing a transient voltage suppression device is also provided. The method comprises providing a first dielectric layer, forming an electrode with an integrally formed gap according to an additive formation process, providing a second dielectric layer having at least one opening formed therein, securing the second dielectric layer to the first dielectric layer with the opening in the second dielectric layer overlying the gap, introducing a variable impedance material into the opening, and substantially filling the gap in the electrode with the variable impedance material.

A method of fabricating a variable impedance material is provided as well. The method comprises mixing conductive particles and solvated polymer with insulator particles and filler particles, wherein the filler particles include an arc quenching material. The mixed material is vulcanized, thereby providing a material exhibiting a relatively high impedance when subjected to voltage and/or current up to a predetermined threshold value, and exhibiting a relatively low impedance when subjected to voltage and/or current that exceeds the predetermined threshold.

According to still another embodiment, a transient voltage suppression device is provided. The device comprises a first dielectric layer, means for providing a gapped conductive path on the first dielectric layer, and means for exhibiting a relatively high impedance through the gapped conductive path when subjected to voltage and/or current up to a predetermined threshold value and exhibiting a relatively low impedance through the gapped conductive path when subjected to voltage and/or current that exceeds the predetermined threshold. Means are also provided, secured to the first dielectric layer, for exposing a portion of the gapped electrode for introduction of the means for exhibiting. The means for exposing further confining the means for exhibiting to a predetermined location in the vicinity of the gapped electrode when the means for exhibiting is introduced to the means for exposing.

A variable impedance material for a transient voltage suppression device is also provided. The material comprises a binder, conductive particles, insulator particles, and filler material, wherein the filler material includes an arc quenching material. The volume ratio of conductive particles to binder is between about 0.5 and 2.0, and the material contains no more than about 5% by weight of organic material.

BRIEF DESCRIPTION OF THE DRAWINGS

FIG. 9 is an exploded view of a bulk manufacture of the device shown in FIG. 8.

DETAILED DESCRIPTION OF THE INVENTION

Figure 1:
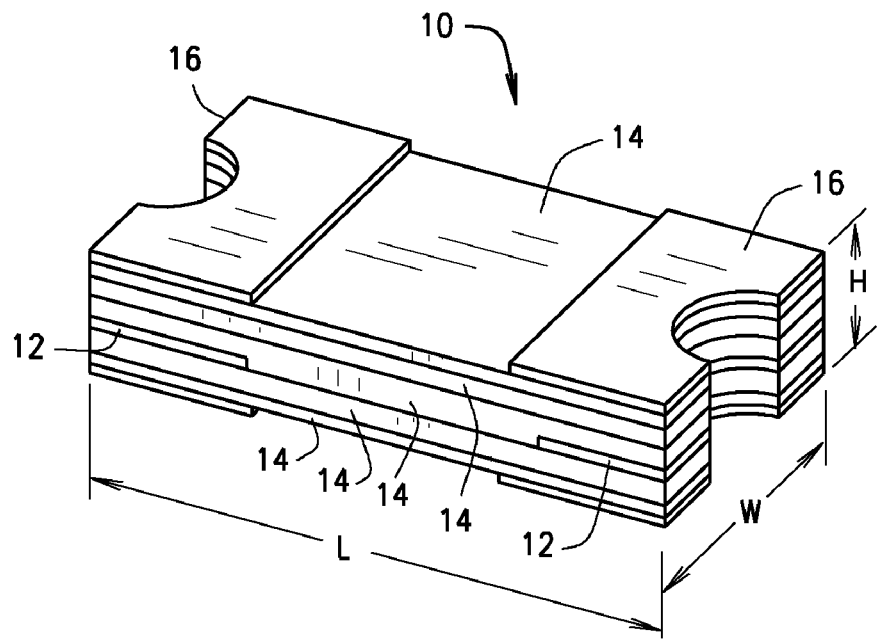
FIG. 1 is a perspective view of a transient voltage suppression device according to the present invention.

FIG. 1 is a perspective view of a transient voltage suppression device 10 in accordance with an exemplary embodiment of the present invention. For the reasons set forth below, the transient voltage suppression device 10 is believed to be manufacturable at a lower cost than conventional transient voltage suppression device while providing higher production yields of satisfactory products.

The transient voltage suppression device 10 may have a layered construction, described in detail below, and includes an electrode 12 defining a conductive path enclosed in a number of dielectric layers 14 as explained below. The electrode 12 includes a gap (not shown in FIG. 1) that interrupts the conductive path, and a variable impedance material, described below, is provided in the gap. The variable impedance material exhibits a relatively high impedance when subjected to voltage and/or current up to a predetermined threshold value, and exhibits a relatively low impedance when subjected to voltage and/or current that exceeds the predetermined threshold.

The electrode 12 electrically extends between and is in a conductive relationship with surface mount terminations 16. The terminations 16, in use, are coupled to conductors, terminals, contact pads, or circuit terminations of a printed circuit board (not shown). More specifically, one of the terminations 16 may be coupled to a signal conductor, and the other of the terminations 16 may be coupled to a ground conductor. When voltage and or/current current flowing through the signal conductor is below a predetermined threshold, the variable impedance material is in the high resistance state (sometimes referred to herein as the "off-state") in which substantially no current flows through the variable impedance material in the electrode gap. Consequently, in the off state, substantially no current is carried across the electrode between the terminations 16, during which time the signal conductor is ungrounded.

As the voltage and/or current flowing through the signal conductor approaches the predetermined threshold, dependant upon characteristics of the variable impedance material employed in the device 10, the variable impedance material switches to the low impedance state (referred to herein as the "on-state"). That is, the electrical characteristics of the variable impedance material will change such that most, if not all, of the current flows through the variable impedance material in the electrode gap, and the current flows between the terminations 16 to ground. As such, a pulse or transient voltage experienced by the signal conductor is be shunted to the ground conductor, and the voltage associated with the pulse may be clamped at a relatively low value for the duration of the pulse. The variable impedance material recovers after the voltage or current pulse has passed and returns to its high impedance state. Thus, the signal conductor and associated circuitry can continue normal operation shortly after the pulse has ended. In this way, the circuitry associated with the signal conductor is protected without substantial interruption to the affected circuitry. Transient voltage and surge protection for circuitry connected to the device is therefore provided.

In an illustrative embodiment, the transient voltage suppression device 10 may have a chip configuration. That is, the device 10 may be generally rectangular in shape and includes a width W, a length L and a height H suitable for surface mounting of the device 10 to a printed circuit board while occupying a small space. For example, L may be approximately 0.040 to 0.060 inches and W may be approximately 0.020 to 0.030 inches, such that the transient voltage suppression device occupies roughly the same area on a circuit board as other electrical chip components, including but not limited to chip fuses, chip resistors, and the like as those in the art may appreciate. H is approximately equal to the combined thickness of the various layers 12 and 14 employed to fabricate the transient voltage suppression device 10. Notably, H is considerably less than either L or W to maintain a low profile of the transient voltage suppression device 10. It is recognized, however, that actual dimensions of the device 10 may vary from the illustrative dimensions set forth herein to greater or lesser dimensions, including dimensions of more than one inch without departing from the scope of the present invention.

Figure 2:
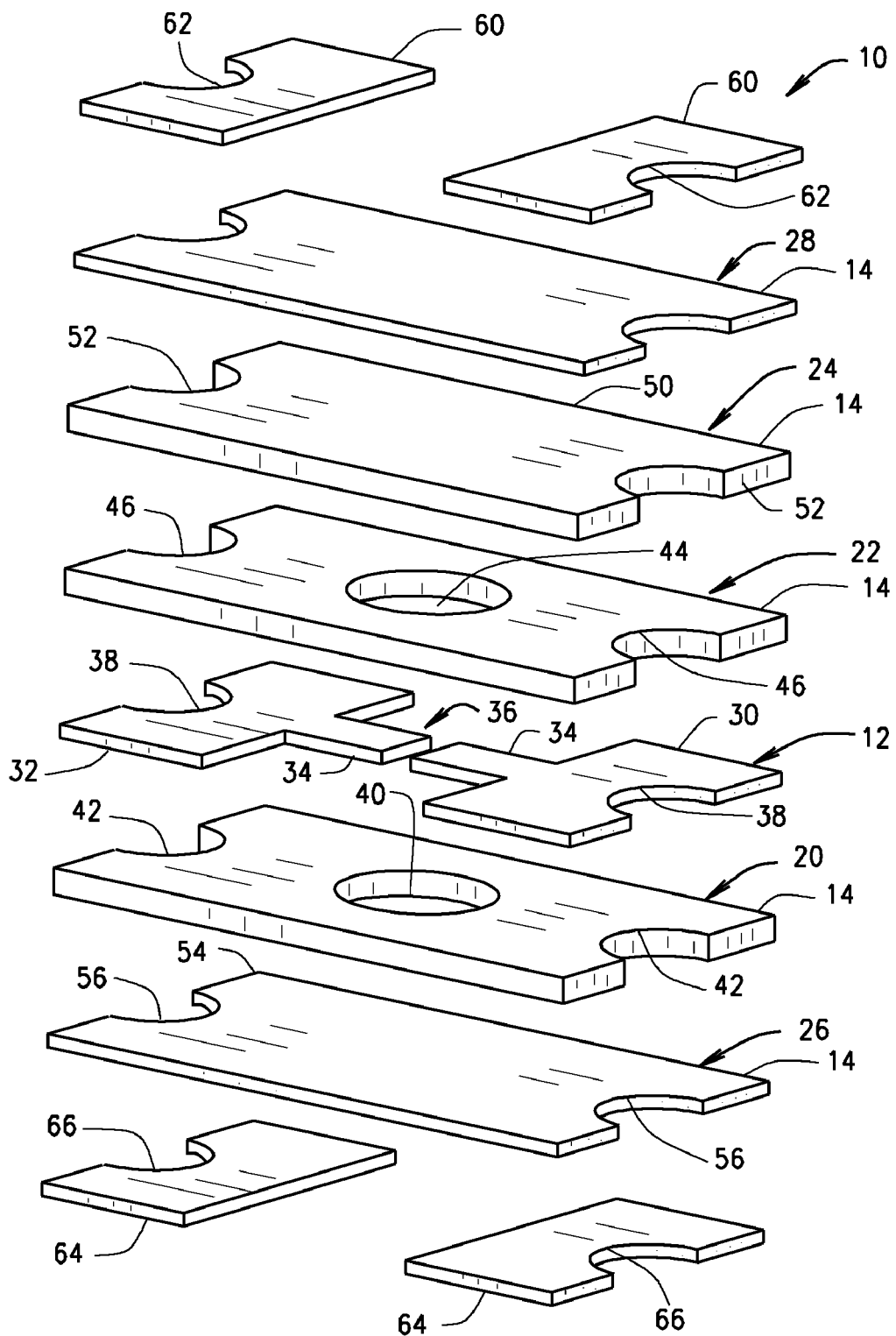
FIG. 2 is an exploded perspective view of the device shown in FIG. 1.

FIG. 2 is an exploded perspective view of the transient voltage suppression device 10 illustrating the various layers 12, 14 employed in fabrication of the transient voltage suppression device 10. Specifically, in an exemplary embodiment, the transient voltage suppression device 10 may be constructed essentially from six layers including the electrode 12 sandwiched between a first and second dielectric layers 20, 22 which, in turn, are sandwiched between third and fourth dielectric layers 24, 26. A fifth dielectric layer 28 overlies the third dielectric layer 24. As will be appreciated below, the dielectric layers 20, 22, 24, 26 and 28 each serve a distinct purpose in the device 10, and the materials used to fabricate the layers accordingly vary from one another.

Unlike known transient voltage suppression devices, the electrode 12 is an electroformed, 3-20 micron thick nickel foil which is fabricated and formed independently from the first and second dielectric layers 20 and 22. Specifically, in an illustrative embodiment, the electrode 12 is fabricated according to a known additive process, such as electro-forming process wherein the desired shape of the electrode layer is plated up, and a negative image is cast on a photo-resist coated substrate (not shown). A thin layer of metal, such as nickel, is subsequently plated onto the negative image cast, and the plated layer is then peeled from the cast to be a free standing foil extending between the first and second dielectric layers 20 and 22. While nickel is believed to be advantageous for its structural strength when peeled from the cast, it is contemplated that other metals and conductive compositions and alloys may likewise be used to form the electrode in another embodiment of the invention.

As shown in FIG. 2, the electrode 12 is formed in the shape of a capital I with wider anchor portions 30 and 32 and a relatively narrow path portion 34 extending between the anchor portions 30 and 32, thereby defining a conductive path between the first and second dielectric layers 20 and 22. A small gap 36, on the order of several microns in an exemplary embodiment, interrupts the conductive path through the path portions 34, and the variable impedance material (not shown in FIG. 2) is applied to the gap 36 in the manner explained below to interconnect the path portions 34 of the electrode 12. Also, termination openings 38 are formed into the ends of the anchor portions 30, 32 to provide electrical connection of the electrode 12 to a circuit board as explained below. The wider anchor portions accommodate manufacturing tolerances in formation of the openings 38.

Notably, the electrode gap 36 is integrally formed into the image cast so that the electroformed electrode is plated with the gap 36 already present or pre-formed. That is, a separate manufacturing step to form the gap 36 is avoided, and so are related costs and difficulties of doing so, by forming the gap simultaneously with the electrode 12 in the electroforming process. The gap 36 may be formed centrally in the electrode 12 as shown in FIG. 2, or may be formed elsewhere within the electrode 12 if desired. While one particular shape of the electrode 12 is illustrated in FIG. 2, it is understood that various other shapes of the shapes of the electrode 12 may likewise be employed in other embodiments.

Separate and independent formation of the electrode 12 allows for other advantages as well in comparison to known constructions of transient voltage suppression devices. For example, separate and independent formation of the electrode 12 permits greater accuracy in the control and position of the electrode layer with respect to the dielectric layers 20, 22, 24, 26 and 28 when the transient voltage suppression device 10 is constructed. In comparison to etching processes of known such devices, independent formation of the electrode 12 permits greater control over the shape of the conductive path relative to the first and second dielectric layers 20, 22. While etching tends to produce oblique or sloped side edges of the conductive path once formed, substantially perpendicular side edges are possible with electroforming processes, therefore providing a more repeatable performance in the trigger voltage, clamping voltage, and leakage current characteristics of the manufactured device 10. Additionally, separate and independent formation of the electrode provides for electrodes having varying thickness in a vertical dimension (i.e., perpendicular to the dielectric layers) to produce vertical profiles or contours in the electrode 12 that can vary performance characteristics. Still further, multiple metals or metal alloys may be used in the separate and independent formation process, also to vary performance characteristics of the device.

While electroforming of the electrode 12 in a manner separate and distinct from the first and second dielectric layers 20, 22 is believed to be advantageous, it is understood that the electrode 12 may be alternatively formed by other methods while still obtaining some of the advantages of the present invention. For example, the electrode 12 may be an electro deposited metal foil applied to the first dielectric layer 20 according to known techniques, including other additive techniques such as screen printing and deposition techniques, and subtractive techniques such as chemical etching and the like as known in the art.

The first dielectric layer 20 underlies the electrode 12 and includes a circular shaped opening 40 underlying a portion of the path portions 34, and in particular, the gap 36, of the electrode 12. Termination openings 42 are formed into either end of the first dielectric layer 20. Likewise, the second dielectric layer 22 overlies the electrode 12 and includes a circular shaped opening 44 overlying a portion of the path portions 34, and in particular, the gap 36, of the electrode 12. Termination openings 46 are formed into either end of the second dielectric layer 22.

Notably, and in an exemplary embodiment, the path portions 34 of the electrode 12 contact a surface of neither of the first and second dielectric layers 20, 22 in the vicinity of the gap 36. The openings 40, 44 in the respective first and second dielectric layers 20, 22 expose the gap 36 in the electrode and define a receptacle above and below the electrode gap 36 for the introduction of the variable impedance material. That is, the openings 40, 44 provide a confined location for the variable impedance material in the device 10, and it may be accordingly be ensured that the variable impedance material substantially surrounds and fills the gap 36 to ensure proper operation of the device 10.

While circular shaped openings 40, 44 are illustrated in the first and second dielectric layers 20, 22, it is recognized that other shapes may be used to form the openings in another embodiment as desired.

In an illustrative embodiment, the first and second dielectric layers 20, 22 are each fabricated from a commercially available, 50 micron thick polyimide dielectric film including a 4 micron adhesive film to secure the layers to one another and to the electrode 12. It is appreciated, however, that in alternative embodiments, other dimensions of materials may be utilized, and further it is contemplated that suitable electrical dielectric and insulation materials (polyimide and non-polyimide), may be employed. It is also recognized that adhesiveless materials may be employed in the first and second dielectric layers 20 and 22.

The third dielectric layer 24 overlies the second dielectric layer 22 and includes a continuous surface 50 extends between termination openings 52 at opposing ends of the third dielectric layer 24. Likewise, the fourth dielectric layer 26 underlies the first dielectric layer 20 and includes a continuous surface 54 extending between termination openings 56 at opposing ends of the fourth dielectric layer 26. The continuous surfaces 50, 54 of the respective third and fourth dielectric layers 24, 26 closes the openings 40, 44 in the first and second dielectric layers 20, 22 and seals the variable impedance material and the gap 36 of the electrode.

In an illustrative embodiment, the third and fourth dielectric layers 24, 26 are each fabricated from a polyimide dielectric film. In one exemplary embodiment, the third dielectric layer 24 may be a 50 micron thick polyimide dielectric film including a 4 micron adhesive film to secure the layers to one another, and the fourth dielectric film may be a 25 micron thick polyimide dielectric film including an 18 micron copper laminate. It is appreciated, however, that in alternative embodiments, other dimensions of materials may be employed, and it is recognized that other suitable electrical dielectric and insulation materials (polyimide and non-polyimide), may be employed. It is further contemplated that adhesiveless materials may be employed in the third and fourth dielectric layers 24 and 26.

The fifth dielectric layer 28 overlies the third dielectric layer 24, and in an exemplary embodiment may be a 25 micron thick polyimide dielectric film including an 18 micron copper laminate. The includes surface mount pads 60 formed on one surface thereof in a known manner. The termination pads 60 include termination openings 62. The fourth dielectric layer 26 also includes surface mount pads 64, and each of the pads 64 includes termination openings 66. In an exemplary embodiment the fourth and fifth dielectric layers 26, 28 are copper clad polyimide laminates, and the copper is etched away from the layers to form the surface mount pads 60, 62. It is understood, however, that the pads 60, 62 could be alternatively formed in another known manner using, for example, electroforming, printing, or deposition techniques.

Figure 5:
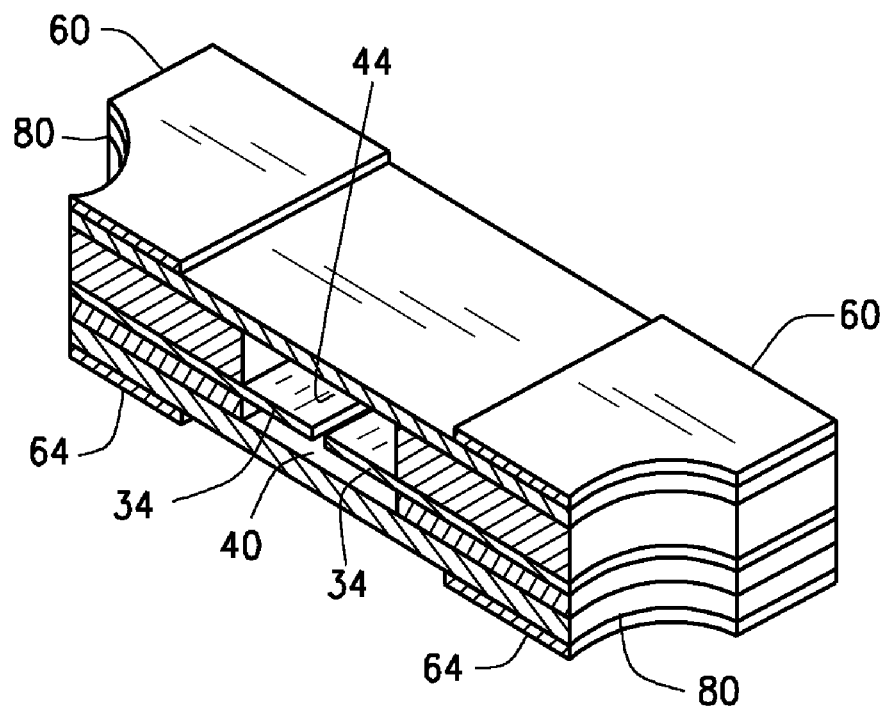
FIG. 5 is a partial sectional view of the device shown in FIG. 1 at another stage of manufacture.

When the layers 12, 20, 22, 24, 26, and 28 are stacked, the termination openings of the layers are aligned with one another and the inner surfaces of the termination openings are metallized with a conductive material, such as copper, on a vertical face 80 (FIG. 5) thereof to complete a conductive path between the surface mount pads 60, 64 and minor surfaces of the anchor portions 30, 32 of the electrode 12. In other words, the metallized face 80 extends substantially perpendicular to the major planar surfaces of the electrode 12, and is tangential to the vertical end faces (the minor surfaces) of the anchor portions 30, 32. Castellated contact terminations are therefore provided on the ends of the device 10.

It is also recognized that at least some of the benefits of the present invention may be achieved by employing other termination structure than in lieu of castellated contacts for connecting the transient voltage suppression device 10 to an electrical circuit. Thus, for example, contact leads (i.e. wire terminations), wrap-around terminations, dipped metallization terminations, and the like may be employed as needs dictate or as desired.

For purposes of describing an exemplary manufacturing process employed to fabricate the transient voltage suppression device 10, the dielectric layers of the transient voltage suppression device 10 are referred to according to the following table:

| Process Layer | FIG. 2 Layer | FIG. 2 Reference |
|---|---|---|
| 1 | First Dielectric Layer | 20 |
| 2 | Second Dielectric Layer | 22 |
| 3 | Third Dielectric Layer | 24 |
| 4 | Fourth Dielectric Layer | 26 |
| 5 | Fifth Dielectric Layer | 28 |

Figure 3:
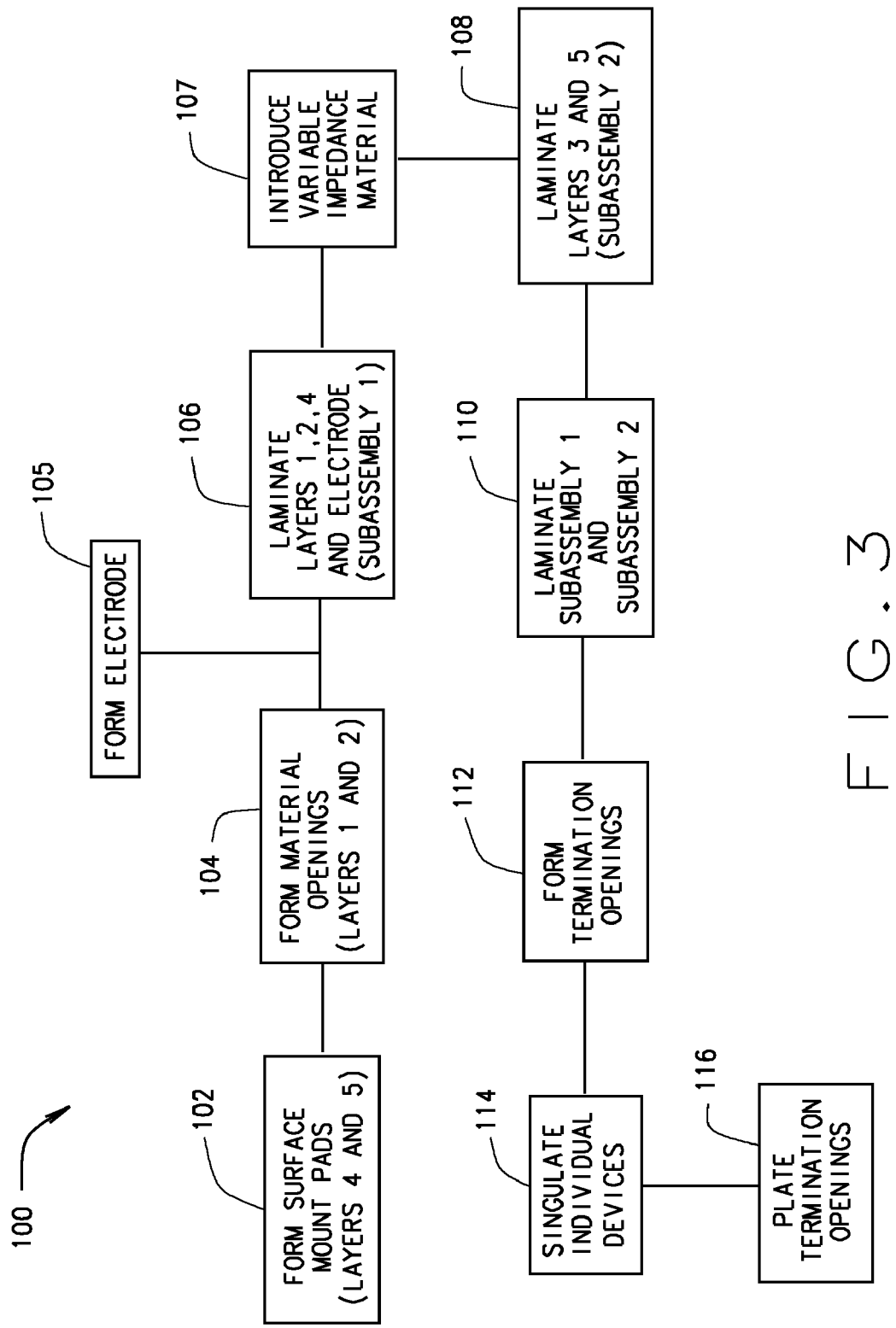
FIG. 3 is a process flow chart of a method of manufacturing the device shown in FIGS. 1 and 2.

Using these designations, FIG. 3 is a flow chart of an exemplary method 100 of manufacturing the transient voltage suppression device 10 (shown in FIGS. 1 and 2).

The surface mount pads are formed 102 on layers 4 and 5 according to any of the techniques described above or known in the art, and the openings in layers 1 and 2 are formed 104 prior to assembly of the device as explained below. Electrodes 12 are formed 105 independently from dielectric layers, such as with the aforementioned electroforming process.

Figure 4:
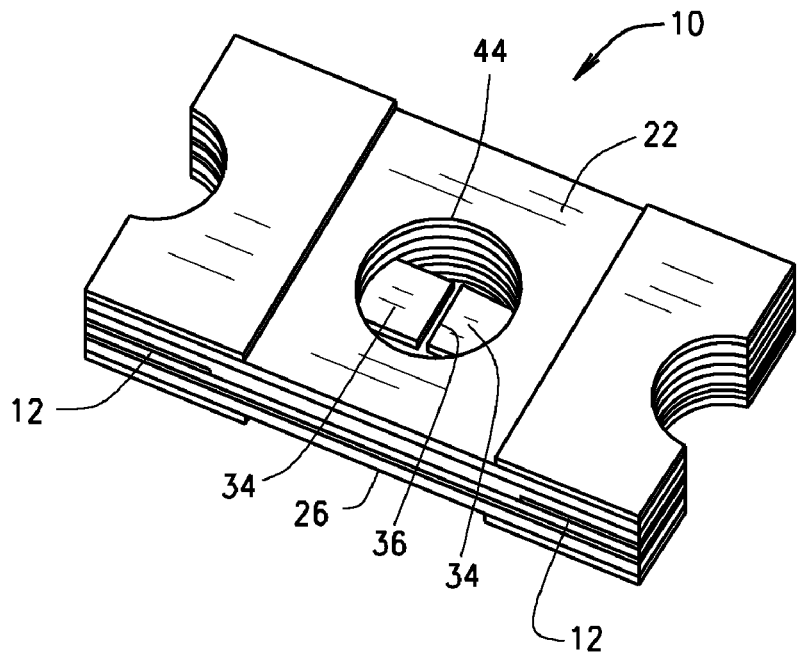
FIG. 4 is a perspective view of the device shown in FIG. 1 at a first stage of manufacture.
Figure 5A:
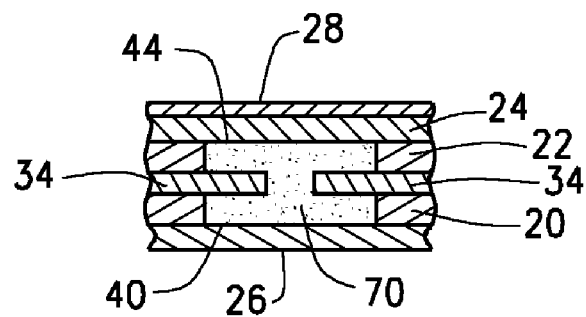
FIG. 5a is an elevational view of a portion of FIG. 5.

Layers 1, 2, and 4 are laminated 106 to one another with the electrode 12 extending between layers 1 and 2, and with layer 4 closing the opening 40 in layer 4. Thus, as shown in FIG. 4, a subassembly is formed wherein the electrode path portions 34 and the electrode gap 36 are exposed and accessible within the opening 44 of layer 2, while layer 4 closes the opening 40 in layer 1 proximate the electrode gap 36. The variable impedance material 70 (FIG. 5a) is then introduced 107 to the opening 44 and fills each of the opening 44 in layer 2 and the opening 40 in layer 1, so that the electrode path portions 34 and the electrode gap 36 are substantially surrounded by the variable impedance material 70 both above and below the electrode path portions 34 and the gap 36, and while substantially filling the gap 36 with the variable impedance material 70.

Layers 3 and 5 are laminated 108 to one another to form a second subassembly for the device 10, and then the second subassembly is laminated to the first subassembly from step 106. When the first and second subassemblies are laminated to one another, the second subassembly closes the opening 44 in layer 2.

Figure 6:
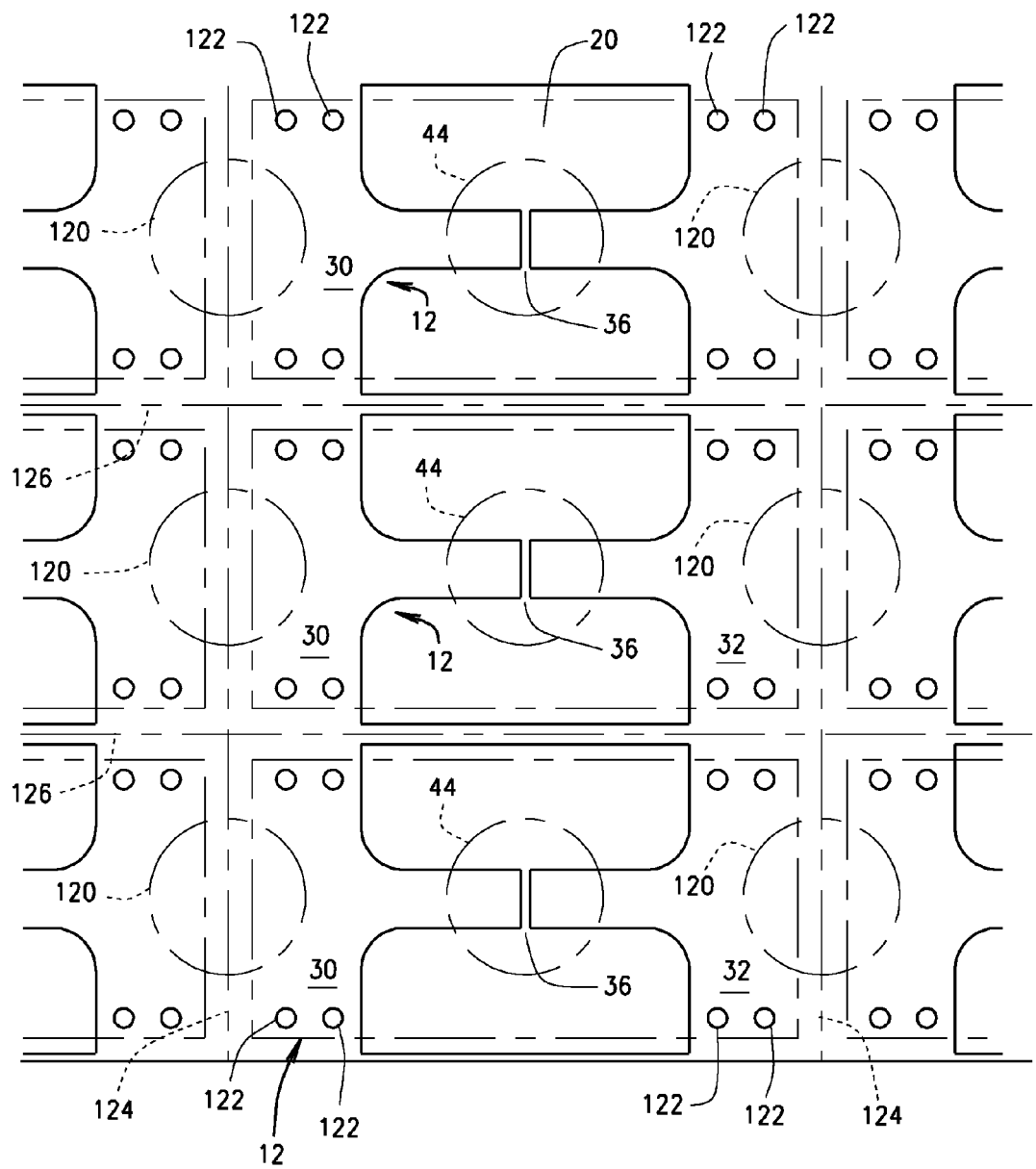
FIG. 6 is a top plan view of a portion of the device shown in FIG. 1 at a bulk stage of manufacture.

The termination openings are then formed 112 through the laminated first and second subassemblies according to, for example, a known drilling process While transient voltage suppression devices 10 could be manufactured singly according to the method thus far described, in an illustrative embodiment, transient voltage suppression devices 10 are fabricated collectively in sheet form and then separated or singulated 114 into individual devices 10, as shown schematically in FIG. 6 wherein a plurality of electrodes 12 including gaps 36 are formed on a larger panel of material, and with the openings 44 and the termination openings 120 outlined in phantom. Additionally, as can be seen in FIG. 6, the anchor portions 30, 32 of the electrodes include anchoring holes 122 that serve to position and maintain the electrodes 12 relative to and in between layer 1 and layer 2. A cutting tool may be moved along intersecting dicing lines 124, 126 to singulate the devices 10.

The devices 10 may be formed in a batch process, or with a continuous roll to roll lamination process to manufacture a large number of transient voltage protection devices with minimal time.

The termination openings are plated or otherwise metallized 116 on a vertical face 80 thereof (FIG. 5), either before or after the singulation 114 of the devices, to complete the terminations 16 shown in FIG. 1.

It is contemplated that greater or fewer layers may be fabricated and assembled into the device 10 without departing from the basic methodology described above. Using the above described methodology, transient voltage suppression devices may be efficiently formed using low cost, widely available materials in a batch process using relatively inexpensive known techniques and processes. Additionally, the methodology provides greater process control in fewer manufacturing steps than conventional transient voltage suppression device constructions. As such, higher manufacturing yields may be obtained at a lower cost.

Figure 7:
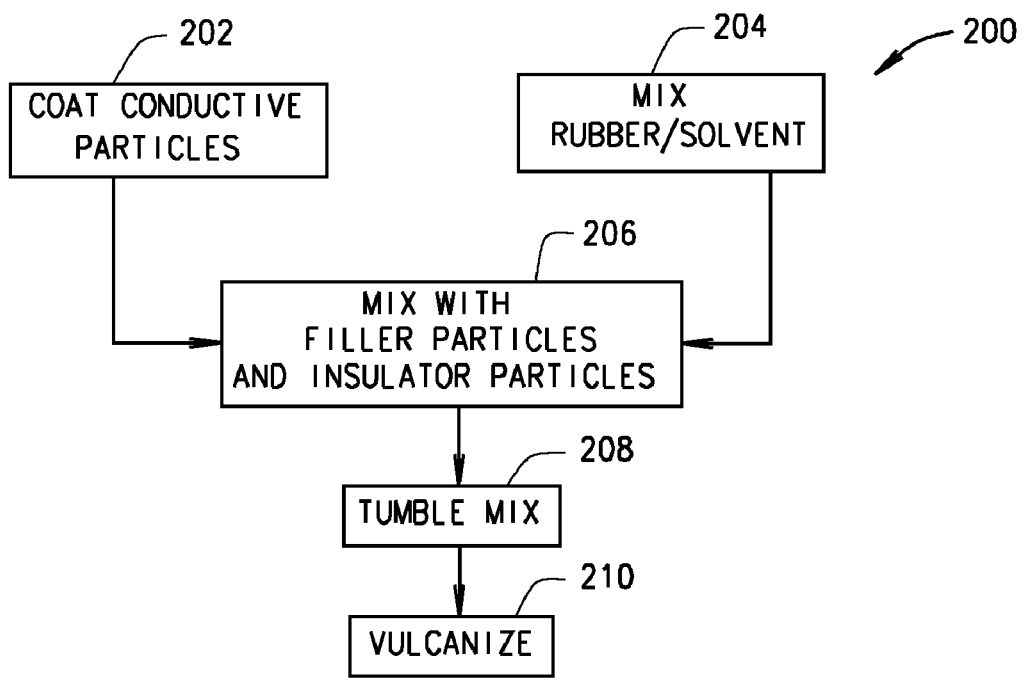
FIG. 7 is a process flowchart for the manufacture of a variable impedance material for the device shown in FIGS. 1-6.

In an exemplary embodiment, the variable impedance material 70 may be formulated from the following exemplary ingredients: conductive particles such as aluminum particles, a solvent such as Methyl n-Amyl Ketone (MnAK), a binder of polymer material such as flourosilicone rubber, insulator particles such as aluminum oxide, and filler particles including an arc quenching material such as barium sulfate and insulator spacer particles such as spherical borosilicate powders. The ingredients are processed as follows according to the method 200 illustrated in FIG. 7 to formulate the variable impedance material.

The conductive particles may be pre-coated 202 with an insulating material such as fumed silica, and the solvent and flourosilicone rubber are preferably premixed 204 in, for example, a planetary mixer for about 24 hours to provide solvated rubber. The solvated rubber is then mixed 206 with the pre-coated conductive particles and the filler material including the arc quenching particles and the insulator spacer particles, and the insulator particles in a mixer such as an overhead or bead mill for about 0.5 hours. Optionally, the mixture may be tumbled 208, for example, for about 24 hours after mixing. Then, the material may be vulcanized 210 and preserved for use in manufacturing the transient surge suppression devices 10.

Preferably, the variable impedance material 70 includes no more than 5% by weight of organic material, and thus for practical purposes is substantially free of organic material. Also, the volume percent ratio of conductive particles to rubber is preferably between about 0.5 to about 2, and more specifically between about 0.75 to about 1.5.

The choice of binder polymer and/or amount of filler in the variable impedance material 70, or the degree of crosslinking or vulcanization of the material can be varied to change tensile properties of the material and affect the thermal stress induced in the material when the material is heated as a result of a voltage pulse during operation of the device 10. By strategically selecting the binder polymer and/or amount of filler in the material, the degree of crosslinking or vulcanization of the material, the stress in the material in an overvoltage condition may be controlled to produce desired switching properties of the material between the on and off states. In general, the more stress that the device is subjected to, which is related to the binder polymer and amount of filler in the material formulation, the voltage at which the material changes from the off state to the on state is lowered. Thus, devices 10 having different sensitivities to overvoltage pulses may be provided.

For greater endurance to high voltage transient pulses, an anti-tracking material, such as iron oxide mixed with a polymer such as silicone, can be added to the filler in the material formulation. By varying the amount of anti-tracking material in the formulation, insulating properties and anti-tracking properties of the device 10 during an overvoltage condition may accordingly be varied.

The above-described formulation and method is believed to provide consistent variable impedance material for the device 10 at a lower cost, with less difficulty, and with a reduced processing time in relation to known formulations of variable impedance materials. Such formulation, as previously mentioned, produces a material exhibiting a relatively high impedance when subjected to voltage and/or current up to a predetermined threshold value, and exhibiting a relatively low impedance when subjected to voltage and/or current that exceeds the predetermined threshold. By way of example only, when used with the device 10 in the manner described above, the device 10 has a trigger voltage of about 100 to 300 V that causes the material to change from the high resistance state to the low impedance state, produces a clamped voltage during a transient voltage pulse event of about 20 to about 40 V, exhibits a leakage current of less than about 1 nA in normal operating conditions, and the material may withstand about 1000 transient voltages or pulse events.

While an exemplary variable impedance material has been described that may be utilized in the device 10, it is understood that other known variable impedance materials may be employed that are fabricated according to other known methods, while still achieving at least some of the advantages of the present invention. Likewise, while an exemplary transient voltage suppression device has been described that utilizes the variable impedance material produced according to the method 210, it is recognized that the variable impedance material could be used in other types of transient voltage protection devices. The foregoing description is therefore provided for illustrative purposes only and is not intended to limit the device 10 to use with any particular variable impedance material, or to limit the variable impedance material to use with any particular device.

Figure 8:
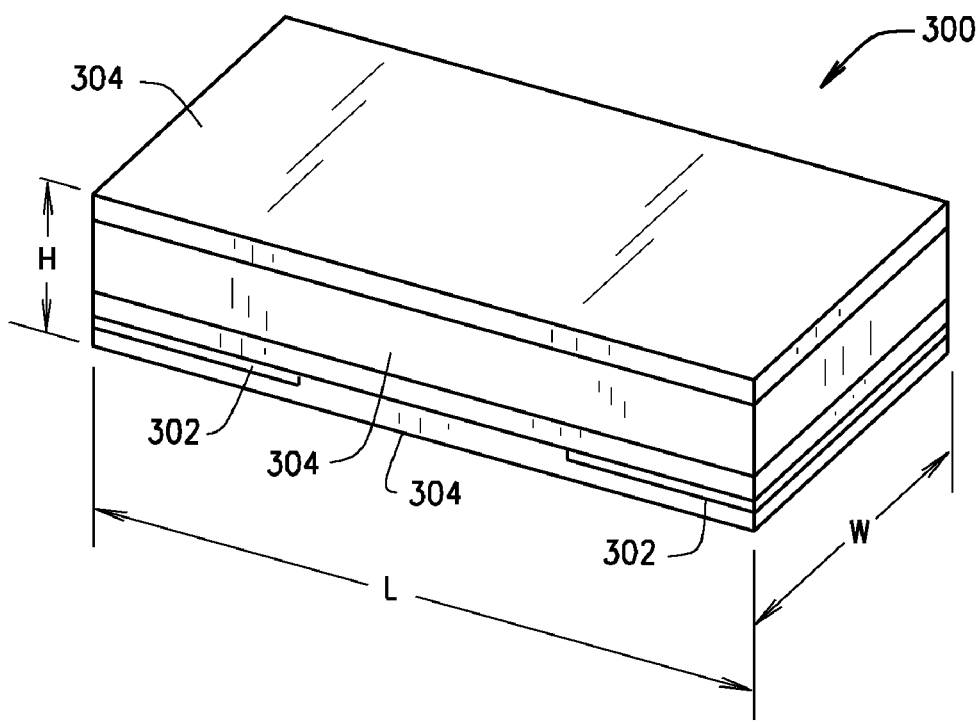
FIG. 8 is a perspective view of another embodiment of a transient voltage suppression device.

FIG. 8 is a perspective view of another embodiment of a transient voltage suppression device 300 in accordance with another exemplary embodiment of the present invention. The transient voltage suppression device 300 is also believed to be manufacturable at a lower cost than conventional transient voltage suppression device while providing higher production yields of satisfactory products.

The transient voltage suppression device 300 may have a layered construction, described in detail below, and includes an electrode 302 defining a conductive path enclosed in a number of dielectric layers 304 as explained below. The transient voltage suppression device 300 may have a chip configuration as illustrated in FIG. 8. That is, the device 300 may be generally rectangular in shape and includes a width W, a length L and a height H suitable for surface mounting of the device 300 to a printed circuit board while occupying a small space. For example, L may be approximately 0.040 to 0.060 inches and W may be approximately 0.020 to 0.030 inches, such that the transient voltage suppression device occupies roughly the same area on a circuit board as other electrical chip components, including but not limited to chip fuses, chip resistors, and the like as those in the art may appreciate. H is approximately equal to the combined thickness of the various layers 302 and 304 employed to fabricate the transient voltage suppression device 10. Notably, H is considerably less than either L or W to maintain a low profile of the transient voltage suppression device 300. It is recognized, however, that actual dimensions of the device 10 may vary from the illustrative dimensions set forth herein to greater or lesser dimensions, including dimensions of more than one inch without departing from the scope of the present invention.

FIG. 9 is an exploded perspective view of transient voltage suppression device 300 in a bulk fabrication assembly. Specifically, in an exemplary embodiment, the transient voltage suppression device 300 is constructed essentially from four layers including an electrode 302 sandwiched between a first and second dielectric layers 306, 308 and a third dielectric layer 310 overlying the second dielectric layer 308.

The electrode layer 302 is an electroformed, 3-20 micron thick copper or nickel foil which is fabricated and formed independently from the first and second dielectric layers 306 and 308, the advantages of which are described above, although it is understood that the electrode layer 302 may be formed according to other known techniques in lieu of electroformation techniques if desired. Furthermore, other metals and conductive compositions and alloys may be used to form the electrode layer 302.

The electrode layer 302 is formed into multiple elements each having the shape of a capital I with wider anchor portions 311 and 312 and a relatively narrow path portion 314 extending between the anchor portions 311 and 312, thereby defining a conductive path between the first and second dielectric layers 306 and 308. A small gap 316, on the order of several microns in an exemplary embodiment, interrupts the conductive path through the path portions 314, and the variable impedance material 320 is applied to the gap 316 in the manner explained below to interconnect the path portions 314 of the electrode 302. The electrode gaps 316 are integrally formed into the image cast so that the electroformed electrode is plated with the gap 316 already present or pre-formed, thereby eliminating separate manufacturing steps to form the gaps 316, together with related costs and difficulties. The gaps 316 may be formed centrally in the electrode path portions 314 as shown in FIG. 9, or may be formed elsewhere within the electrode layer 302 if desired. While one particular shape of the electrode layer 302 is illustrated in FIG. 9, it is understood that various other shapes of the shapes of the electrode layer 302 may likewise be employed in other embodiments.

While electroforming of the electrode layer 302 in a manner separate and distinct from the first and second dielectric layers 306 and 308 is believed to be advantageous, it is understood that the electrode layer 302 may be alternatively formed by other methods while still obtaining some of the advantages of the present invention. For example, the electrode layer 302 may be an electro deposited metal foil applied to the first dielectric layer 306 according to known techniques, including other additive techniques such as screen printing and deposition techniques, and subtractive techniques such as chemical etching and the like as known in the art.

Figure 11:
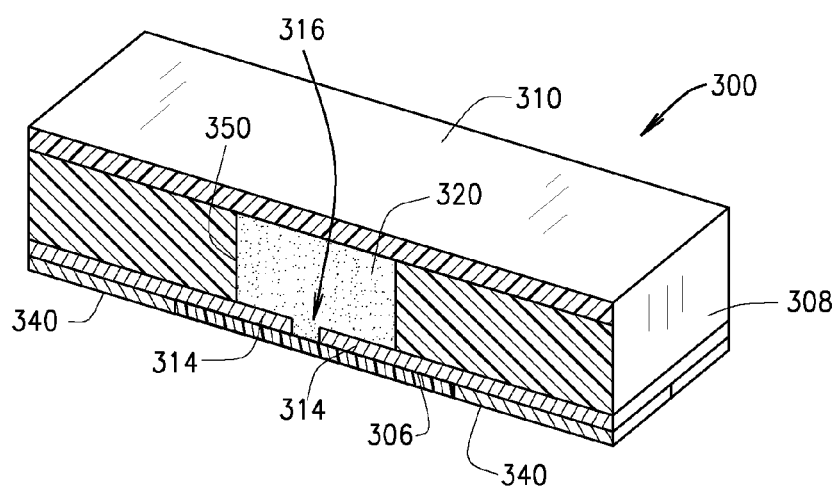
FIG. 11 is a sectional view of the device shown in FIG. 8.

The first dielectric layer 306 underlies the electrode layer 302 and includes circular shaped termination openings 330 underlying the anchor portions 311, 312 of the electrode layer 302, and more specifically, the termination openings 330 are spaced from the gaps 316 in the electrode layer 302. The termination openings 330 are filled with a conductive metal such as copper, for example, to provide surface mount pad terminations that directly engage and are in abutting contact with the major planar surfaces of the electrode anchor portions 311, 312, as best shown in FIG. 11.

It is recognized that at least some of the benefits of the present invention may be achieved by employing other termination structure in lieu of the surface mount pad terminations 340 for connecting the transient voltage suppression device 300 to an electrical circuit. Thus, for example, contact leads (i.e. wire terminations), wrap-around terminations, dipped metallization terminations, castellated contacts and the like may be employed as needs dictate or as desired.

Referring back to FIG. 9, the second dielectric layer 308 overlies the electrode layer 302 and includes circular shaped openings 350 overlying a portion of the electrode layer path portions 314, and in particular, the gaps 316, of the electrode layer 302. As such, the path portions 314 of the electrode layer 302 are exposed in the vicinity of the electrode gaps 316 within the openings 350. The openings 350 in the respective second dielectric layer 308 expose the gaps 316 in the electrode and defines receptacles above the gaps 316 for the introduction of the variable impedance material 320 (also shown in FIG. 11). That is, the openings 350 provide a confined location for the variable impedance material 320, and it may be accordingly be ensured that the variable impedance material substantially surrounds and fills the gaps 316 to ensure proper operation of the device 300. The third dielectric layer 310, however, is solid and has no openings in the vicinity of the electrode layer gaps 316.

In an illustrative embodiment, the first and second dielectric layers 306, 308 are each fabricated from a commercially available polyimide dielectric film including an adhesive to secure the layers to one another and to the electrode layer 302. As one example, the first dielectric layer 306 may be a commercially available 2 mil polyimide film, and the second dielectric layer 308 may be a commercially available 5 mil polyimide film.

It is appreciated, however, that in alternative embodiments, other suitable electrical dielectric and insulation materials (polyimide and non-polyimide), may be employed, and further that adhesiveless materials may be employed in the first and second dielectric layers 306 and 308.

The third dielectric layer 310 overlies the second dielectric layer 308 and includes a continuous surface 360 with no openings therein. The continuous surface 360 of the third dielectric layer 310 closes the openings 350 in the second dielectric layer 308 and seals the variable impedance material 320 and the electrode gasp 316.

In an illustrative embodiment, the third dielectric layer 310 is fabricated from a polyimide dielectric film. It is appreciated, however, that in alternative embodiments, other suitable electrical dielectric and insulation materials (polyimide and non-polyimide), may be employed, including an epoxy coating in lieu of a polyimide dielectric film.

Figure 10:
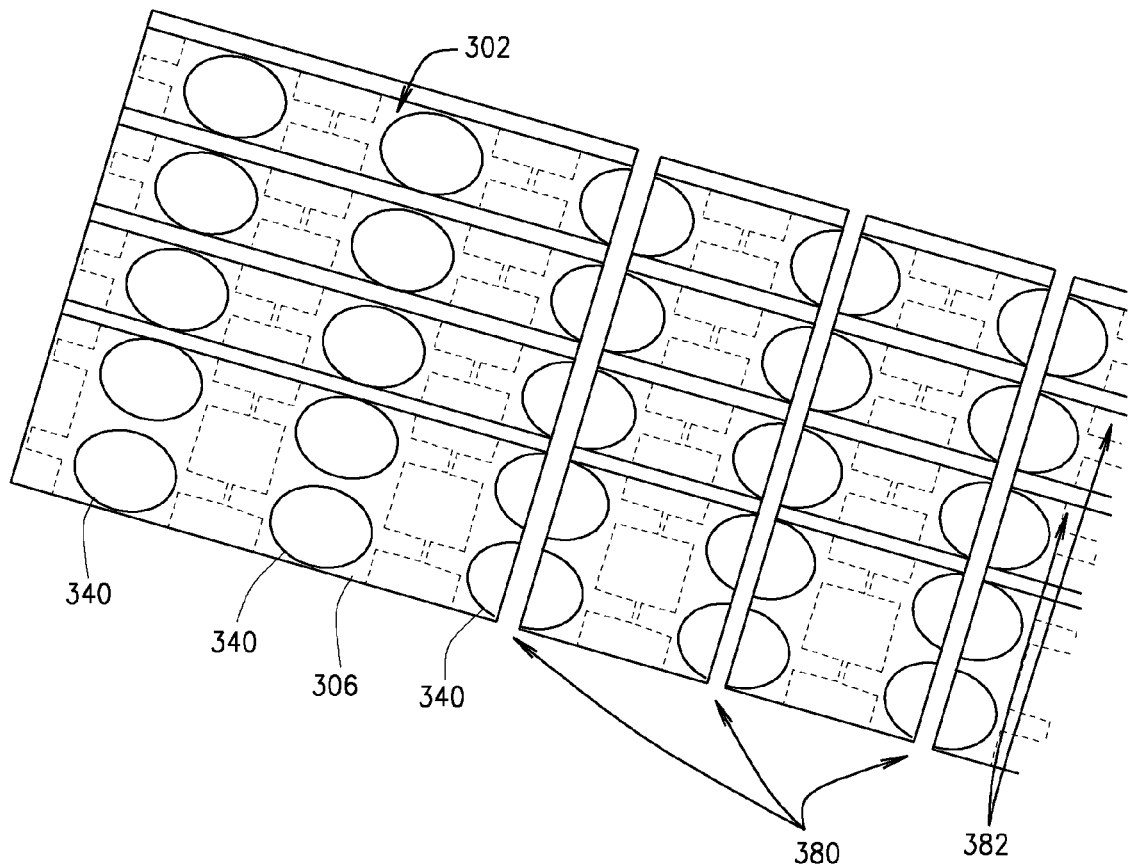
FIG. 10 is a bottom view of the bulk manufacture shown in FIG. 10 at one stage in the manufacturing process.

When the layers 302, 306, 308, and 310 are stacked and secured together with the variable impedance material 320 therein, the pads 340 are formed in the termination openings 330 of the first dielectric layer as shown in FIG. 10. FIG. 10 also schematically illustrates the electrode layer 302, and dicing lines 380 and 382 to singulate the assembled layers into discrete devices 300.

Once constructed, the device 300 operates substantially similar to the device 10 as described above.

For purposes of describing an exemplary manufacturing process employed to fabricate the transient voltage suppression device 300, the dielectric layers of the transient voltage suppression device 300 are referred to according to the following table:

| Process Layer | FIG. 2 Layer | FIG. 9 Reference |
|---|---|---|
| 1 | First Dielectric Layer | 306 |
| 2 | Second Dielectric Layer | 308 |
| 3 | Third Dielectric Layer | 310 |

Figure 12:
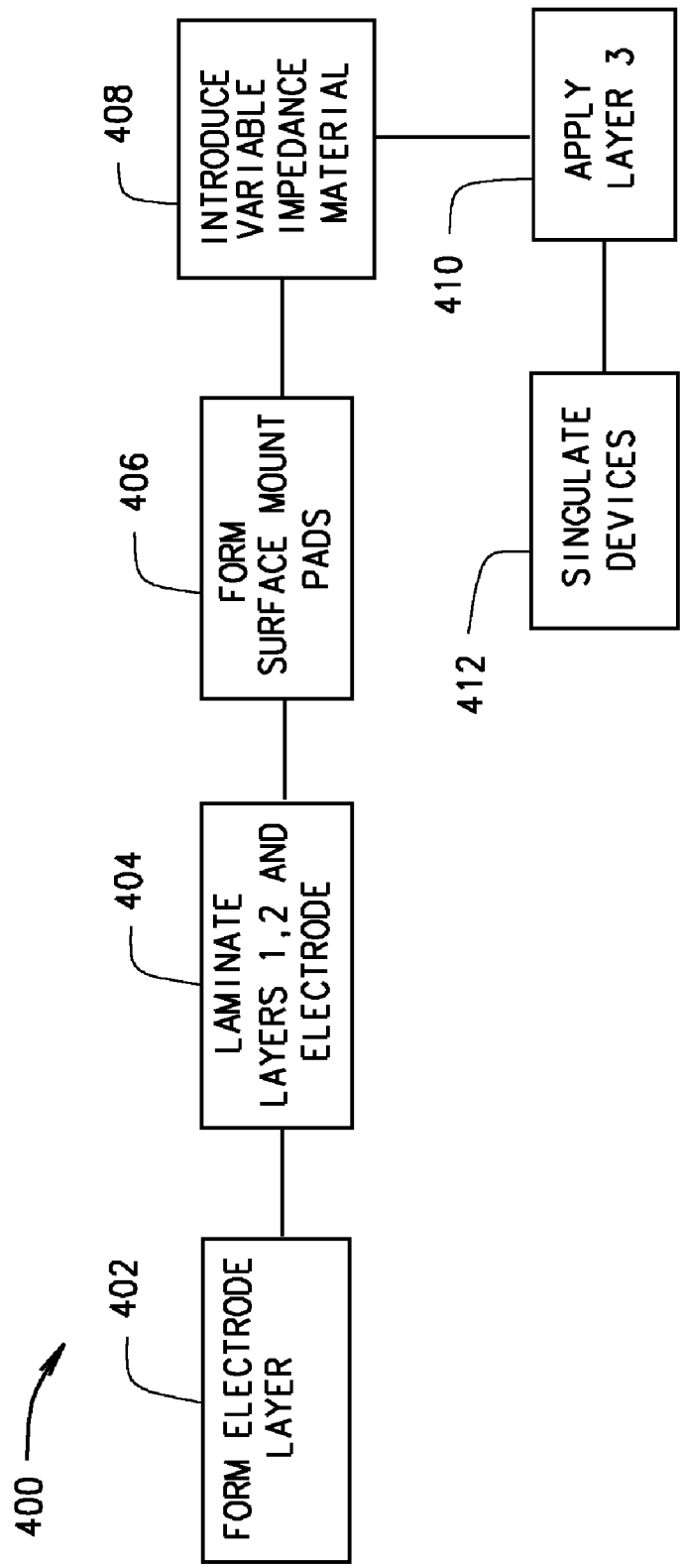
FIG. 12 is a process flow chart of a method of manufacturing the device shown in FIG. 8.

Using these designations, FIG. 12 is a flow chart of an exemplary method 400 of manufacturing the transient voltage suppression device 300.

The electrode layer is formed 402 independently from dielectric layers, such as with the aforementioned electroforming process, or another formation process known in the art, and layers 1 and 2 are laminated 404 to one another with the electrode layer extending between layers 1 and 2. Thus, a subassembly is formed wherein the electrode path portions 314 and the electrode gaps 316 are exposed and accessible within the openings 350 of layer 2, and the anchor portions 311, 312 of the electrode layer are exposed within the termination openings 330 of layer 1.

The surface mount pads are plated 406 within the openings in layer 1 in contact with the anchor portions 311, 312, and the variable impedance material 320 is introduced into the openings in layer 2 to substantially surround the electrode path portions 314 and fill the gaps 316. The variable impedance material may be the same or different from the variable impedance material 70 described above.

Layer 3 and is then applied 408 to the layer 2 in a known manner, such as a lamination process in the event that a polyimide material is used for layer 3, or by coating and curing in the case of an epoxy material being used for layer 3. Layer 3 closes the openings in layer 2 and seals the variable impedance material therein.

Finally, the individual components or devices 300 are separated or singulated 410 from one another along the dicing lines shown in FIG. 10. While transient voltage suppression devices 300 are described as being fabricated collectively in sheet form and then separated or singulated 410 into individual devices 300, the devices 300 could be individually fabricated if desired. The devices 300 may be formed in a batch process, or a continuous roll to roll lamination process to manufacture a large number of transient voltage protection devices with minimal time.

It is contemplated that greater or fewer layers may be fabricated and assembled into the device 300 without departing from the basic methodology described above. Especially when the openings 330 and 350 are pre-formed in layers 1 and 2, the method 400 may be completed in a relatively short period of time and with a reduced number of steps than the method 100 described above.

Using the above described methodology, transient voltage suppression devices may be efficiently formed using low cost, widely available materials in a batch process using relatively inexpensive known techniques and processes. Additionally, the methodology provides greater process control in fewer manufacturing steps than conventional transient voltage suppression device constructions. As such, higher manufacturing yields may be obtained at a lower cost.

Figure 13:
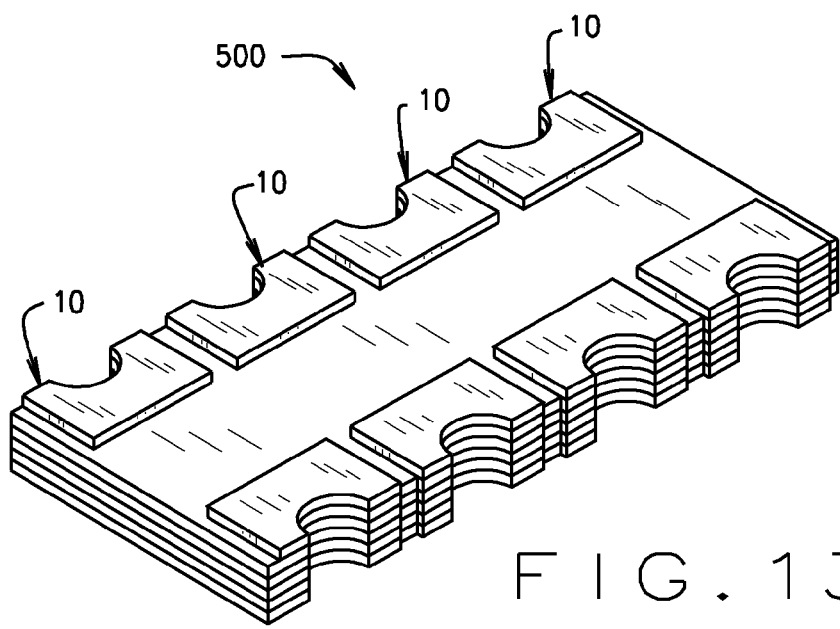
FIG. 13 is a perspective view of another embodiment of a transient voltage suppression device according to the present invention.
Figure 14:
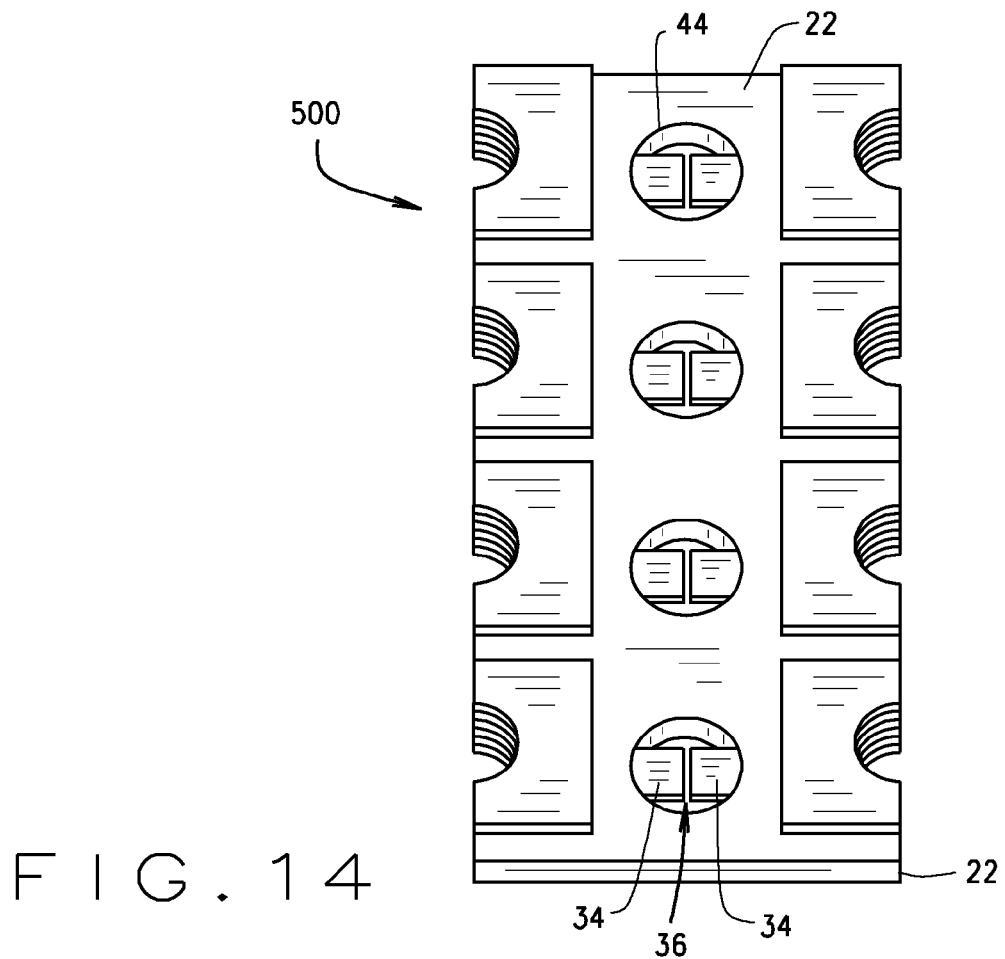
FIG. 14 is a top plan view of the device shown in FIG. 13 at one stage of manufacture.

FIGS. 13 and 14 illustrate another embodiment of a transient voltage suppression device 500 that is essentially a combination of four devices 10 described above in relation to FIGS. 1-6. Thus, in the illustrated embodiment, the device 500 provides four devices 10 in an in-line arrangement that may be connected to electronic circuitry in parallel to one another. While four devices 10 are integrated in the device 500 shown in FIG. 13, it is appreciated that more or less devices 10 may be provided in the device 500.

The device 500 may be constructed substantially as described above, with appropriate modifications of the dicing lines to form in-line devices 500 in lieu of discrete devices 10. As shown in FIG. 14, the electrode path portions 34 and the gaps 36 are exposed within the openings 44, 40 in the first and second dielectric layers 22, 20, respectively. Introduction of the variable impedance material 70 is therefore simplified, and for the reasons set forth above, the device 500 is manufacturable at a lower cost with higher production yields than known devices.

In-line combinations of devices 300, described above in relation to FIGS. 8-11, could likewise be provided according the methodology described above, with modification of the dicing lines to form in-line devices instead of single or discrete devices.

While the invention has been described in terms of various specific embodiments, those skilled in the art will recognize that the invention can be practiced with modification within the spirit and scope of the claims.

What is claimed is:

1. A transient voltage suppression device, comprising:
    a first dielectric layer defining a first surface;
    an electrode extending on and in surface contact with the first surface and defining a conductive path, the electrode including a gap that interrupts the conductive path;
    a variable impedance material substantially filling the gap in the electrode; and
    a second dielectric layer overlying the electrode, wherein the electrode is sandwiched between the first and second dielectric layers and wherein the variable impedance material is in abutting contact with at least a portion of an upper major surface and at least a portion of a bottom major surface of the electrode proximate the gap.

2. A transient voltage suppression device in accordance with claim 1, wherein the electrode is formed independently of the first and second dielectric layers.

3. A transient voltage suppression device in accordance with claim 2, wherein the electrode is integrally formed with the gap in an additive formation process.

4. A transient voltage suppression device in accordance with claim 3, wherein the electrode comprises an electroformed thin foil.

5. A transient voltage suppression device in accordance with claim 4, wherein the electroformed thin foil is nickel.

6. A transient voltage suppression device in accordance with claim 1, further comprising castellated contact terminations establishing a conductive path to the at least one electrode on either side of the gap.

7. A transient voltage suppression device in accordance with claim 1, wherein each of the first and second dielectric layers are fabricated from a polymer material.

8. A transient voltage suppression device in accordance with claim 7, wherein the polymer material is a polyimide.

9. A transient voltage suppression device comprising:
    a first planar dielectric layer;
    a second planar dielectric layer;
    at least one generally planar electrode extending between and in surface contact with at least one of the first planar dielectric layer and the second planar dielectric layer, the electrode formed with a first portion, a second portion and a gap that interrupts a conductive path between the first portion and the second portion; and a variable impedance material extending above the gap, below the gap, and filling the gap in the electrode.

10. The device of claim 9, wherein one of the first and second dielectric layer includes an opening, the variable impedance material contained in the opening.

11. The device of claim 10, wherein:
each of the first and second dielectric layers include a first major surface, a second major surface and a thickness between the first and second major surfaces; and
the opening extends entirely through the thickness.

12. The device of claim 10, wherein each of the first and second dielectric layers includes an opening, the variable impedance material contained in each opening above and below the gap.

13. The device of claim 12, wherein:
each of the first and second dielectric layers include a first major surface, a second major surface and a thickness between the first and second major surfaces; and
the opening in each of the first and second openings extends entirely through the respective thickness.

14. The device of claim 9, wherein the opening is shaped to expose a distal end of each of the first and second portions of the electrode proximate the gap.

15. The device of claim 14, wherein each distal end includes an end surface, opposed major surfaces and opposed side surfaces.

16. The device of claim 15, wherein the variable impedance material surrounds the opposed major surfaces and the opposed side surfaces of each distal end.

17. The device of claim 15, wherein the opening is dimensioned to expose the opposed side surfaces of the distal end.

18. The device of claim 17, wherein the opening is substantially circular.

19. The device of claim 9, wherein the first and second dielectric layers are fabricated from a polymer material.

20. The device of claim 9, further comprising surface mount terminations.

21. The device of claim 9, wherein the at least one generally planar electrode comprises a plurality of electrodes spaced apart from one another.

22. The device of claim 9, wherein the electrode includes an upper major surface and a lower major surface, the lower major surface of the electrode being in surface contact with the at least one of the first planar dielectric layer and the second planar dielectric layer, and the variable voltage material being in surface contact with at least a portion of the upper major surface of the electrode proximate the gap.

23. The device of claim 22, wherein the other of the first planar dielectric layer and the second planar dielectric layer includes an upper major surface and a lower major surface, the lower major surface of the other of the first planar dielectric layer and the second planar dielectric layer being in surface contact with the variable voltage material at a location above the gap.

24. The device of claim 22, wherein the variable voltage material is further in surface contact with at least a portion of the lower major surface of the electrode proximate the gap.

25. The device of claim 9, wherein the first and second planar dielectric layers are each a polyimide dielectric film.

26. A transient voltage suppression device comprising:
a laminated structure comprising:
a first planar dielectric layer;
a second planar dielectric layer;
at least one electrode extending between and in surface contact with the first dielectric layer and the second dielectric layer, the electrode formed with a first portion, a second portion, and a gap that interrupts a conductive path between the first portion and the second portion; and
a variable impedance material extending above the gap, below the gap, and filling the gap in the electrode.

27. The device of claim 26, wherein the first portion and second portion of the electrode are generally coplanar.

28. The device of claim 26, wherein each of the first portion and the second portion includes a distal end, the gap extending between the distal ends of the first and second portion.

29. The device of claim 28, wherein one of the first and second dielectric layers includes an opening exposing each of the distal ends of the electrode and the gap.

30. The device of claim 29, wherein the opening is formed completely through a thickness of one of the first and second dielectric layers.

31. The device of claim 28, wherein the distal ends each include an end surface, opposed major surfaces, and opposed side surfaces proximate the end surface, the variable impedance material contacting at least the end surface, one of the opposed side surfaces and one of major surfaces of each distal end.

32. The device of claim 28, wherein the distal ends each include an end surface, opposed major surfaces, and opposed side surfaces proximate the end surface, the variable impedance material surrounding the end surface, the opposed side surfaces and the opposed major surfaces of each distal end.

33. The device of claim 28, wherein the opening is substantially circular.

34. The device of claim 26, further comprising surface mount terminations establishing electrical connection to the respective first and second portions of the electrode.

35. The device of claim 26, wherein the at least one electrode comprises a plurality of electrodes spaced apart from one another.

36. The device of claim 26, wherein the electrode includes an upper major surface and a lower major surface, the lower major surface of the electrode in surface contact with one of the first planar dielectric layer and the second planar dielectric layer, and at least a portion of the variable voltage material in surface contact with the upper major surface of the electrode.

37. The device of claim 26, wherein the first and second planar dielectric layers are each a polyimide dielectric film.

38. A transient voltage suppression device, comprising:
a first dielectric layer defining a first surface;
an electrode extending on and in surface contact with the first surface and defining a conductive path, the electrode including a gap that interrupts the conductive path;
a variable impedance material substantially filling the gap in the electrode; and
a second dielectric layer overlying the electrode and defining a second surface, wherein the first and second surfaces are substantially coextensive;
wherein the electrode is sandwiched between the first and second dielectric layers and at least a portion of the electrode is in abutting contact with the first surface and the second surface; and
wherein the variable impedance material extends below the first surface and above the second surface.

39. The device of claim 38, wherein at least a portion of the variable impedance material contacts one of the first and second surfaces.

40. The device of claim 38 further comprising surface mount terminations.

41. The device of claim 40 wherein the surface mount terminations comprise castellated contact terminations.

42. A transient voltage suppression device, comprising:
a first dielectric layer defining a first surface;
an electrode extending on and in surface contact with the first surface and defining a conductive path, the electrode including a gap that interrupts the conductive path;
a variable impedance material substantially filling the gap in the electrode; and
a second dielectric layer overlying the electrode and defining a second surface;
wherein the electrode is sandwiched between the first and second dielectric layers and at least a portion of the electrode is in abutting contact with the first surface and the second surface;
wherein the variable impedance material extends below the first surface and above the second surface; and
wherein at least a portion of the variable impedance material contacts both of the first and second surfaces.

43. A transient voltage suppression device, comprising:
a first dielectric polymer film layer defining a first surface;
a second dielectric polymer film layer defining a second surface coextensive with the first surface;
an electrode extending between the first and second surface and defining a conductive path, the electrode including a gap that interrupts the conductive path and the electrode including an upper major surface and a lower major surface; and
a variable impedance material substantially filling the gap in the electrode, and the variable impedance material extending above the first upper major surface of the electrode and below the lower major surface of the electrode proximate the gap;
wherein the electrode and the variable voltage material are contained between the first and second surface of the respective first and second dielectric polymer film layers.

* * * * *